United States Patent [19]

Aubert et al.

[11] Patent Number: 4,608,234

[45] Date of Patent: Aug. 26, 1986

[54] DEVICE FOR TENSIONING A THIN PLATE

[75] Inventors: Jean-Jacques Aubert, St. Egreve; Alain Basset, Grenoble; Bernard Bechevet, Claix; Claude Roulin, Grenoble, all of France

[73] Assignee: Commissariat a l'Energie Atomique, France

[21] Appl. No.: 651,528

[22] Filed: Sep. 17, 1984

[30] Foreign Application Priority Data

Sep. 20, 1983 [FR] France ................... 83 14921

[51] Int. Cl.⁴ ............................................. C30B 35/00
[52] U.S. Cl. ..................................... 422/249; 72/457; 72/458; 72/460; 156/617 SP
[58] Field of Search ............... 72/457, 458, 460; 422/249; 156/617 SP

[56] References Cited

U.S. PATENT DOCUMENTS

| | | | |
|---|---|---|---|
| 3,241,352 | 3/1966 | Lincourt | 72/457 |
| 3,338,086 | 8/1967 | Hunter | 72/457 |
| 4,317,799 | 3/1982 | Serafino et al. | 422/249 |

FOREIGN PATENT DOCUMENTS

| | | |
|---|---|---|
| 571849 | 3/1933 | Fed. Rep. of Germany . |
| 2067923 | 11/1969 | France . |
| 2251368 | 11/1973 | France . |
| 1059916 | 10/1963 | United Kingdom . |

Primary Examiner—Arthur Kellogg
Attorney, Agent, or Firm—Cesari and McKenna

[57] ABSTRACT

A device for tensioning a thin plate comprises at least two assemblies, each having tensioning means on one end of the plate and means for rotating the end about an axis perpendicular to the plane of the plate. When this axis does not pass through the center of the end, means for the transverse translation of the end are advantageously added to the assembly. The assemblies are arranged in such a way that the plate is in equilibrium under the tension effect. The device has particular application to the tensioning of a flat resistor for producing materials.

7 Claims, 3 Drawing Figures

DEVICE FOR TENSIONING A THIN PLATE

BACKGROUND OF THE INVENTION

The present invention relates to a device for tensioning a thin plate. It more particularly relates to the tensioning of a flat or planar resistor for producing materials and more generally to the tensioning of a thin plate subject to thermal, mechanical or electrical stresses, so as to keep the said plate flat and taut.

The term "plate or thin plate" is understood to mean in particular a flat resistor or a sheet raised to a high temperature, e.g. by dielectric heating or induction.

Devices for tensioning a thin plate or section are known, in which the plate is tensioned cold between two clamps. Such devices suffer from the disadvantages that they are difficult to regulate and lack precision. Thus, they do not make it possible to adjust the tension during heating. Moreover, they do not make it possible to unbend the thin plate which, under the effect of various unhomogeneities, bend.

SUMMARY OF THE INVENTION

The present invention relates to a device for tensioning a thin plate, which does not suffer from these disadvantages and in particular makes it possible to reduce the bending or buckling of the plate and in certain embodiments to completely unbend the plate.

More specifically, the present invention relates to a device for tensioning a thin plate in a plane, wherein it comprises at least two assemblies, each of which comprises tensioning means on one end of the plate in an axis of the plane and means for rotating said end about an axis perpendicular to the plane, the assemblies being arranged in such a way that the plate is in equilibrium under the tension effect.

The thin plate can have a random shape, e.g. rectangular, square, cruciform, triangular, but more generally polygonal or even circular. For example, in the case of a rectangular plate, it is possible to use two assemblies respectively applied to the small sides of the rectangle. In the case of a triangular or star-shaped plate with three branches, three assemblies are respectively applied to the sides of the triangle or to the three branches of the star. In the case of a cross-shaped plate, four assemblies are respectively applied to the four branches of the cross. In the case of a circular plate, a plurality of assemblies are respectively applied to portions of the circumference of the circle and are regularly spaced from one another.

According to a special embodiment of the device according to the invention, each assembly also comprises means for the transverse translation of the end corresponding to said assembly, in a direction parallel to the plane and perpendicular to the plane and perpendicular to the initial direction of the tension axis associated with the assembly. This special embodiment makes it possible to completely unbend the thin plate, in the case when the latter has been bent.

According to a special embodiment of the invention, each assembly comprises a plate parallel to the plane, the rotation means corresponding to said assembly comprising a base plate which is rotatable on the plate, about an axis perpendicular to the latter and tensioning means associated with the assembly comprise a carriage displaceable in translation on the base plate along an axis of the plane, the latter meeting the axis about which the base plate is rotatable, means for retaining the end corresponding to the assembly and which are rigidly integral with the carriage and elastic means for exerting tension on the carriage.

For example, the plate comprises two rollers or studs, located on a circle centered on the axis about which the base plate rotates and the base plate then has two openings extending over the portions of the circle and traversed by the rollers.

In another special embodiment, each assembly comprises another plate parallel to the plane and on which the plate corresponding to said assembly is displaceable in translation perpendicular to the initial direction of the tension axis associated with said assembly, so as to constitute transverse translation means.

In another special embodiment, each assembly also comprises a main plate parallel to the plane and on which the other plate corresponding to said assembly is displaceable in translation in the initial direction of the tension axis associated with the assembly.

According to another special embodiment, in each assembly the rotation axis of the end associated with said assembly passes through the centre of said end. The device according to the invention can then be constructed in a relatively simple manner, without transverse translation means, whilst still making it possible to completely unbend the plate when it has been bent.

In a special application of the invention, the thin plate conducts electricity and is provided with holes, so as to constitute a flat resistor for producing materials.

Finally, in a special embodiment of the invention corresponding to said application, the retaining means are able to transmit an electric current used for heating the thin plate and are cooled by the circulation of a fluid.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
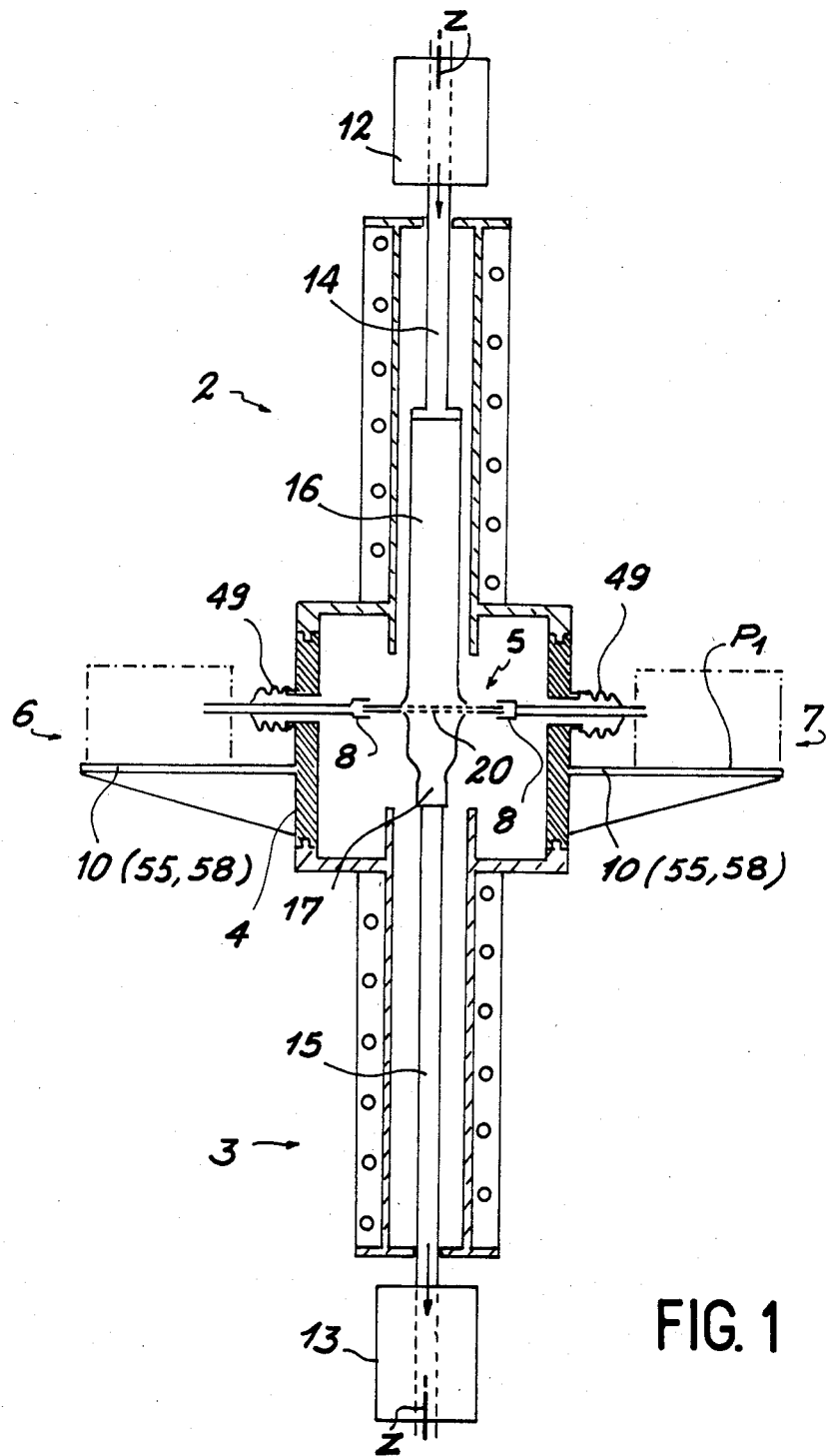
FIG. 1 diagrammatic view of an apparatus for producing materials such as crystals or ceramics, by the so-called "flat resistor method".

The apparatus diagrammatically shown in FIG. 1 essentially comprises a vertical preheating furnace 2 and a vertical post-heating furnace 3 below the preheating furnace 2 and in the extension thereof. The lower end of preheating furnace 2 and the upper end of post-heating furnace 3 are linked with one another by means of a ferrule 4, to which they are both connected. A flat electrical resistor constituted by a thin metal plate, e.g. of platinum, which is provided with calibrated holes 20 is interposed between the two furnaces within ferrule 4.

In an exemplified, but non-limitative manner, plate 5 is rectangular. It is supplied with electric current by not shown means, so that it is heated by the Joule effect in the present case (but any othertype of heating could be used, e.g. high frequency heating).

Plate 5 is kept constantly flat and horizontal as a result of a device according to the invention having two assemblies 6 and 7 constructed in the same way. These two assemblies 6 and 7 face one another outside the ferrule and can serve to hold plate 5 respectively by the shortest ends 8 thereof.

Figure 2:
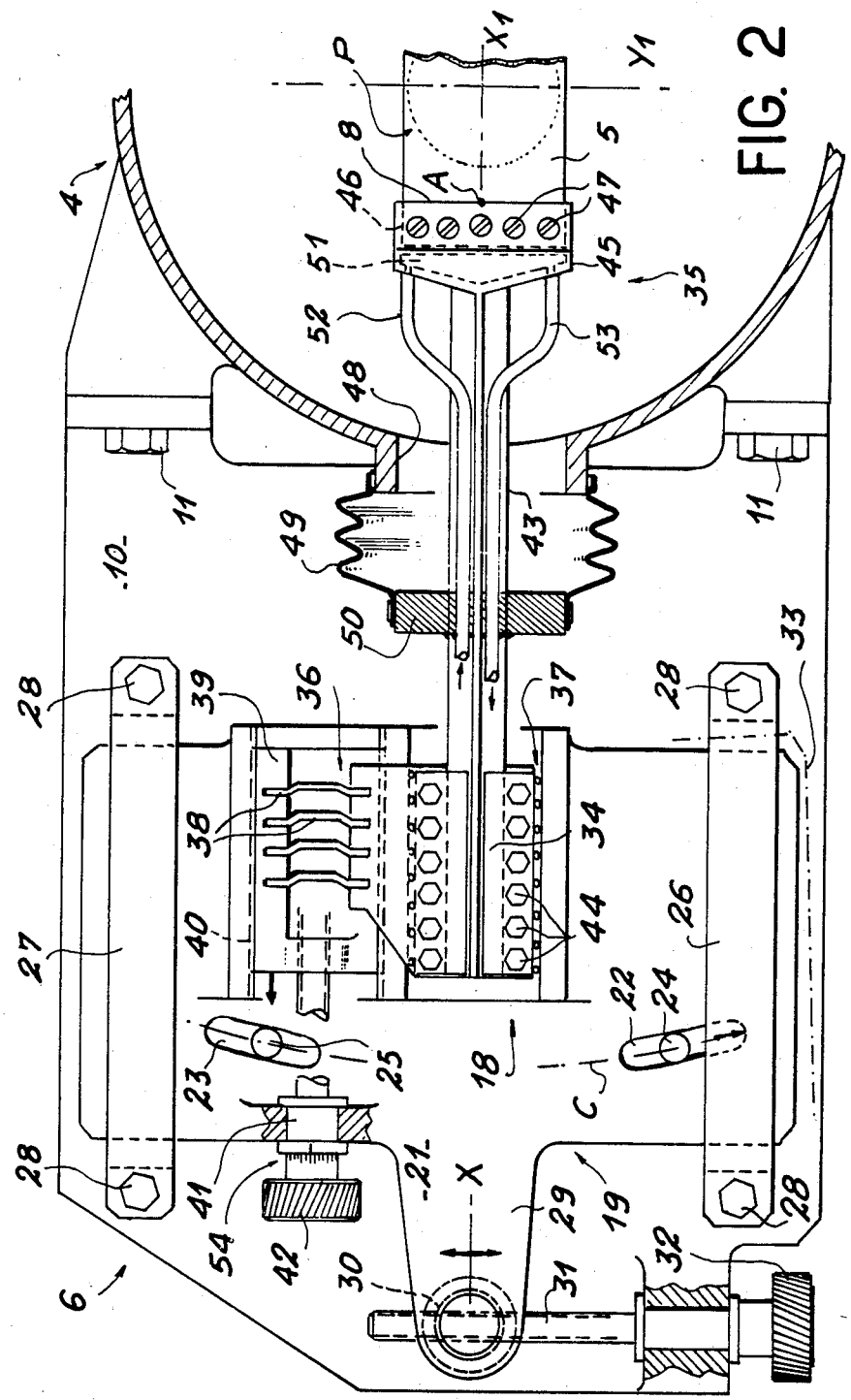
FIG. 2 a diagrammatic, partial view of a special embodiment of a device according to the invention.

Each of the two assemblies 6 and 7 has in particular a plate 10, these two plates being fixed to ferrule 4 in the same horizontal plane $P_1$, e.g. with the aid of bolts 11 (FIG. 2). Bearing in mind the identity of assemblies 6 and 7, only the special embodiments of one of them will be described hereinafter.

The apparatus diagrammatically shown in FIG. 1 also comprises two translation - rotation systems 12, 13, one making it possible to vertically displace a rod 14 in preheating furnace 2 and the other making it possible to vertically displace another rod 15 in the extension of rod 14, in the post-heating furnace 3.

The apparatus, for example, makes it possible to produce a monocrystal of a material such as lithium niobate. In order to do this, a cylindrical bar 16 of the material is fixed to rod 14 and a monocrystalline nucleus 17 of the material is fixed to rod 15. In order to convert bar 16 into a monocrystal by the flat resistor method, said bar and said nucleus 17 are firstly contacted with resistor plate 5, which has been raised to the melting temperature of the material, so that a molten area forms between the bar and the nucleus. The latter are then simultaneously and progressively lowered in such a way that the molten zone moves along the bar, which finally makes it possible to obtain a monocrystalline bar, whose crystalline orientation is the same as that of the nucleus. The post-heating furnace 3 makes it possible to anneal the monocrystal after it has been produced.

FIG. 2 diagrammatically shows a special embodiment of one 6 of the two assemblies forming the device according to the invention, in the special case where there are only two such assemblies, the other assembly 7 being formed in the same way as the assembly shown. The latter essentially comprises tension means 18 on one end 8 of plate 5 and means 19 for rotating said end 8 about a vertical axis, which is called the rotation axis and which is designated in FIG. 2 by its intersection point A with plate 5, said rotation axis carrying the reference A hereinafter.

The rotation means 19 comprise a base plate 21, which rotates on horizontal plate 10, about rotation axis A. Base plate 21 has two openings 22, 23 extending over the portions of a circle C, whose axis is the rotation axis A, so that the latter is defined by the shape of openings 22, 23. Plate 10 comprises two rollers or pins 24, 25 arranged so as to respectively pass through openings 22, 23 and permit the rotation of the base plate about axis A. Rollers 24, 25 slide in openings 22, 23 or the latter are guided in rotation by rollers 24, 25. Base plate 21 is kept in contact with plate 10 by retaining bridges 26, 27, which respectively bestride the edges of the base plate and surround the two openings 22, 23. These bridges are fixed to plate 10 with the aid of bolts 28 for example.

Base plate 21 also has a lever 29 extending horizontally counter to the rotation axis A relative to openings 22, 23 and equidistantly thereof. A pivoting yoke 30 is mounted at the end of lever 39. A screw 31 controlled in rotation by a knurled knob 32 and integral with plate 10 cooperates with the pivoting yoke 30 by screwing therein, in order to rotate base plate 21 around axis A as a result of the openings 22, 23 guided by rollers 24, 25. The mixed line 33 in FIG. 2 shows a possible displacement for base plate 21, said rotation clearly being limited by the length of the openings.

The tensioning means 18 comprise a carriage 34, which is displaceable in translation on base plate 21 in accordance with a horizontal axis X, means 35 for holding end 8 of plate 5, said means being rigidly integral with carriage 34 and elastic means 36 for exerting tension on carriage 34. This carriage moves in translation and without friction in a bearing slide 37, which is fixed to base plate 21. Slide 37 is arranged in such a way that the horizontal tension or translation axis X extends along the radius of circle C, equidistantly of the two openings 22, 23, in such a way that the translation axis X meets the rotation axis A.

The elastic means 36, for example comprise leaf springs 38, which are parallel to one another, as well as another carriage 39 adjacent to carriage 34 and displaceable parallel to the latter in another slide 40 mounted in base plate 21. The leaf springs 38 are rigidly fixed to carriages 34, 39, transversely to the translation axis X. The translation of the other carriage 39 is controlled with the aid of another screw 41, which is integral with base plate 21 and disposed parallel to translation axis X, being provided with a knurled knob 42 making it possible to control the rotation of the screw.

The holding means 35 have a tie bolt 43, which extends along the translation axis X and whereof one end is fixed to carriage 34 by means of screws 44, whilst its other end carries a clamp 45, whose jaws 46 hold the end 8 of plate 5, e.g. with the aid of screws 47, which pass through one of the jaws and whose tightening secures plate 5 between said screws and the other jaw. Plate 5 is fixed by the jaws of assemblies 6 and 7 (FIG. 1), so that it can exert a longitudinal tension on said plate by tensioning means 18. The edges of jaws 46 are perpendicular to translation axis X (FIG. 2) and define the apparent or effective end of plate 5. Openings 22, 23 are made in such a way that the point A is the centre of said effective end, i.e. that the rotation axis A passes through the centre thereof and which will be called "end" for reasons of simplicity.

An opening 48 in ferrule 4 faces assembly 6. Opening 48 is sealingly connected to a bellows 49, which is itself tightly closed by an electrically insulating plate 50. Tie bolt 43 passes through plate 50 with which it is rendered integral.

Plate 5 is supplied with electric current across plates 50 by means of a not shown current generator. For example, the electric current supply takes place by means of leaf springs 38, tie bolt 43 and clamp 45, these different elements having electrically conductive portions connected to one another and appropriately electrically insulated from the remainder of the device, so that there is no risk to users thereof. The said elements are designed so as to be able to transmit a current exceeding 200A and the electrical insulation is designed as a function of this.

The clamp 45 is cooled by the circulation of a fluid, such as water, and to this end has a hollow part 51, into which issue pipes 52, 53, which are respectively provided for the supply and discharge of the fluid and which pass through plate 50.

Obviously, what has been stated hereinbefore with respect to opening 48, bellows 49, the electric power supply and the cooling by a fluid also applies to the other assembly 7 (FIG. 1).

The fitting of plate 5 and the installation of the device according to the invention take place in the following way. Ferrule 4 is separated from furnaces 2 and 3 (FIG. 1), plate 5 is secured in clamps 45 respectively corresponding to the two assemblies. Ferrule 40 is placed between furnaces 3 and 2 and the plates 10 are then mounted on ferrule 4. They incorporate the various translation and rotation members described hereinbefore, particularly carriages 34. The tie bolts 43 can then be fixed to their respective carriages 44.

Leaf springs 38 exert a tension on carriages 34 and consequently on plate 5, which is consequently tensioned. The action on knobs 42 makes it possible to regulate the tensioning force on plate 5. This force can be measured by adding to each screw 41 marking or locating means, e.g. constituted by a vernier with a resetting ring 54.

When plate 5 is heated, it is lengthened and this is compensated by the tensioning means 18. Plate 5 can also become bent and this is eliminated by acting on rotation means 19 via knobs 32. Thus, the device according to the invention shown in FIG. 2 makes it possible to constantly keep plate 5 in a horizontal plane P.

Figure 3:
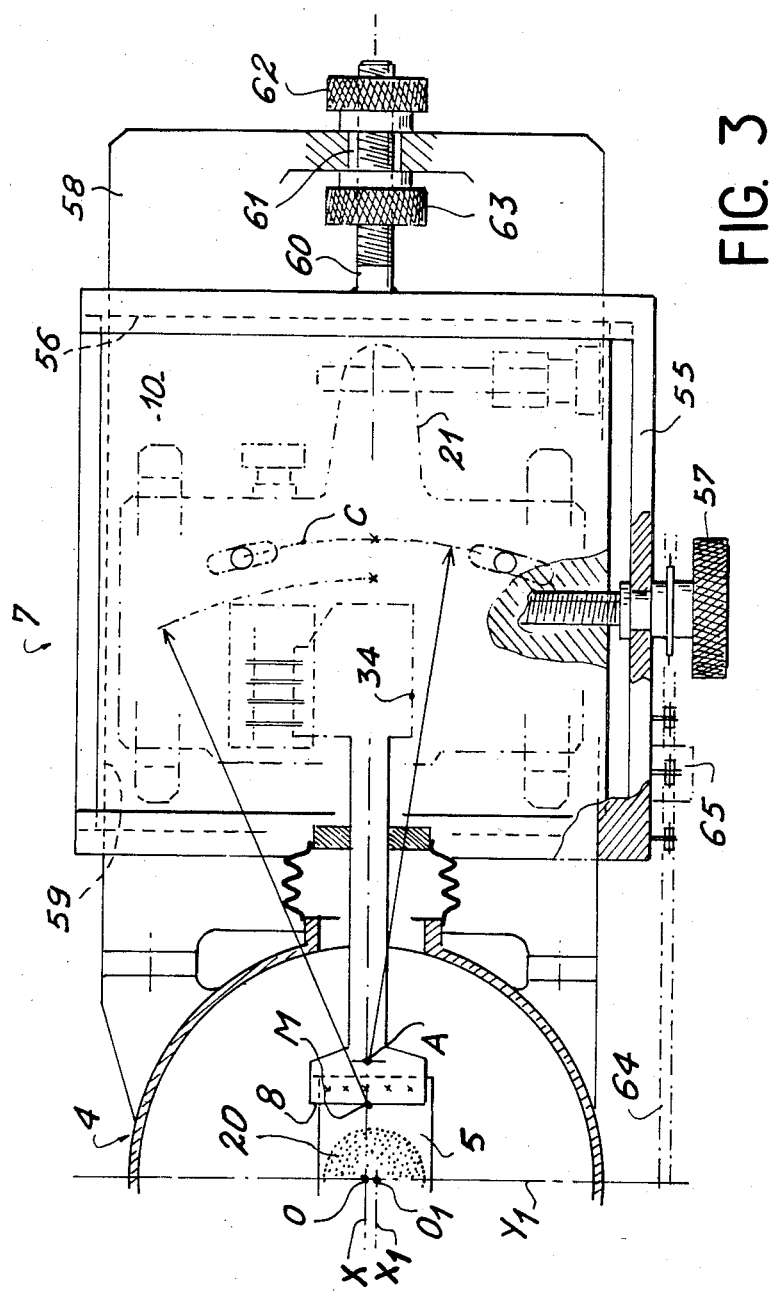
FIG. 3 a partial, diagrammatic view of another embodiment of the device according to the invention.

FIG. 3 diagrammatically shows another embodiment of the invention, corresponding to the case where the rotation axis A does not pass through the centre of end 8 of plate 5 and which is designated by the letter M in FIG. 3. FIG. 3 only shows part of the device corresponding to assembly 7, assembly 6 being constructed in the same way as assembly 7. This embodiment essentially differs from the previously described embodiments in that it also comprises transverse translation means, making it possible to displace end 8 of plate 5 in a horizontal direction perpendicular to a hereinafter defined reference axis $X_1$ with which the tension axis X initially coincides (i.e. before any rotation of the base plate for unbending purposes). In this embodiment, plate 10 is no longer fixed with respect to ferrule 4 as was previously the case. In its preceding position, it is replaced by another horizontal plate 55, which is consequently fixed with respect to ferrule 4. Horizontal plate 10 is displaceable in translation perpendicular to reference axis $X_1$ on the other plate 55 in a slide 56 of said other plate 55. Plate 10 associated with slide 56 consequently constitutes the transverse translation means, said transverse translation being carried out by a screw control 57.

The addition of transverse translation means for end 8 of plate 5 makes it possible to unbend said plate, although the rotation axis A does not pass through the centre M of end 8. The plate is then unbent not only by an appropriate rotation of at least one of the two base plates 21, but also by an appropriate transverse translation of at least one of the two plates 10.

The previously described transverse translation means also permit a lateral recentering of plate 5. The vertical axis Z of the apparatus described relative to FIG. 1 is itself designated by a point $0_1$ in FIG. 3, which is itself defined by the intersection of the two horizontal, perpendicular reference axes $X_1$ and $Y_1$. Initially, the centre 0 of plate 5 coincides with point $0_1$ and the tension axis X coincides with the reference axis $X_1$. The lateral recentering of the plate consists of again placing centre 0 on axis $X_1$, by transverse translation of plate 10, when the centre 0 has moved away from said axis $X_1$.

It may also be necessary to carry out a longitudinal recentering of plate 5. For this purpose, assembly 7 shown in FIG. 3 and also assembly 6 are modified in the following way. Plate 55, which was previously fixed with respect to ferrule 4, is no longer fixed. In its preceding position, it is replaced by a main horizontal plate 58, which is consequently fixed relative to ferrule 4. The other horizontal plate 55 is displaceable in translation parallel to the reference axis $X_1$, relative to the main plate 58, in a slide 59 which is provided on said plate 58 for this purpose. A horizontal screw 60 is fixed to the other plate 50 opposite to plate 5, with respect to said other plate 55. Screw 60 passes through an opening 61 made in the main plate 58. The screw 60 is provided with a pair of knurled nuts 62, 63, permitting the translation regulation and fixing of plate 55 relative to main plate 58.

When plate 5 is flat but offcentered, it is possible to recentre it by transverse translation of plate 10 and by longitudinal translation of the other plates 55. Then, in order not to modify the setting of base plates 21 which has made it possible to obtain the flatness of plate 5, it is possible to render integral in transverse translation plate 10 with the aid of a transmission chain 64 connecting screws 57, so that the rotation of a screw 57 by a certain angle brings about the rotation of the other screw 57 by the same angle and in the same direction. Chain 64 is provided with a turnbuckle 65 permitting independent longitudinal translations of the other plate 55.

With respect to the devices according to the invention described hereinbefore, reference has only been made to a horizontal plane due to the special case of a flat resistor. The thin plate can be held under tension in a vertical or other plane with identical, but appropriately oriented devices.

Moreover, in the described FIGS. 1 to 3, it has been assumed that the plate is rectangular, which is only in fact a non-limitative example. The invention makes it possible to keep flat a thin plate of any random shape. For this purpose, it is merely necessary to use an adequate number of assemblies, such as those described with reference to FIGS. 2 or 3. For example, in the case of a plate which is polygonal, an assembly can be associated with each side of the polygon. In the case of a cross-shaped plate, it is possible to use four assemblies respectively associated with the branches of the cross.

Finally, in the description of FIGS. 2 and 3, consideration has been given to the case where the rotation means are connected to the thin plates via tensioning means. It is obviously possible to produce devices according to the invention corresponding to the reverse case.

What is claimed is:

1. A device for tensioning a thin plate in a plane, said device comprising at least two assemblies, each assembly including a support member lying parallel to said plane, said support member supporting means for tensioning one end of the plate along a tension axis in said plane, said tensioning means comprising means for retaining said end and elastic means for exerting said tension, and said tensioning means being mounted on rotation means comprising a base member which is rotatable on said support member about a rotation axis which is perpendicular to said plane, said assemblies being distributed about the periphery of the plate so as to maintain the plate in equilibrium under the tensions exerted by all of said tensioning means.

2. A device according to claim 1, wherein said support member rests on another parallel support member on which said support member is displaceable in translation perpendicular to the direction of said tension axis.

3. A device according to claim 2, wherein said another support member rests on a third parallel support member on which said another support member is displaceable in translation in a direction parallel to said tension axis.

4. A device according to claim 1, wherein said tension means further comprise a carriage which is displaceable in translation in guiding means which are fixed on said base member along said tension axis, said carriage being rigidly integral with said retaining means, said tension axis intercepting said rotation axis and said elastic means exerting said tension on said carriage.

5. A device according to claim 1, wherein said support member includes a pair of rollers located on a circle centered on said rotation axis and said base member includes a pair of openings extending over portions of said circle and receiving said rollers.

6. A device according to claim 1, wherein said thin plate is electrically conductive and provided with holes so as to constitute a flat resistor for the production of materials.

7. A device according to claim 1, wherein the retaining means are able to transmit an electric current for heating the thin plate and are cooled by the circulation of a fluid.

* * * * *